United States Patent [19]

Ito et al.

[11] 4,305,156

[45] Dec. 8, 1981

[54] ROTARY SWITCH TYPE TELEVISION TUNER

[75] Inventors: Katsuo Ito; Bunjiro Murata, both of Kanazawa; Yoji Maeda, Ishikawa, all of Japan

[73] Assignee: Murata Manufacturing Co., Ltd., Japan

[21] Appl. No.: 104,443

[22] Filed: Dec. 17, 1979

[30] Foreign Application Priority Data

Dec. 28, 1978 [JP] Japan ............................ 53-182911[U]

[51] Int. Cl.³ .............................................. H03J 5/02
[52] U.S. Cl. ................................... 455/170; 455/175; 334/49; 334/85
[58] Field of Search ............... 455/170, 173, 175, 178; 334/1, 2, 3, 47, 49, 50, 51, 85, 88

[56] References Cited

U.S. PATENT DOCUMENTS 3,309,613 3/1967 Bell ...................................... 455/173
3,328,700 6/1967 Chipman .............................. 455/173
4,157,504 6/1979 Ito et al. ............................... 455/175

Primary Examiner—Joseph A. Orsino, Jr.
Assistant Examiner—Tommy P. Chin
Attorney, Agent, or Firm—Ostrolenk, Faber, Gerb & Soffen

[57] ABSTRACT

A television tuner comprises a rotary switching shaft, switching plates associated with the rotary switching shaft, and an input tuning portion, an interstage tuning portion and a frequency converting portion coupled to the switching plates and adapted for channel selection by means of the rotary switching shaft. An additional plate is provided between one switching plate associated with the interstage tuning portion and another switching plate associated with the frequency converting portion. The additional plate is provided with a surface acoustic wave device performing the function of a video intermediate frequency filter and with an integrated circuit including a video intermediate frequency amplifier and a video detector.

5 Claims, 5 Drawing Figures

ROTARY SWITCH TYPE TELEVISION TUNER

BACKGROUND OF THE INVENTION

1. Field of the Invention

The present invention relates to a television tuner. More specifically, the present invention relates to a rotary switch type VHF television tuner adapted for channel selection by means of a mechanical switching means.

2. Description of the Prior Art

FIG. 1 is a block diagram showing a portion of a television receiver in which the present invention can be advantageously employed. A VHF television signal received by an antenna 1 is selectively amplified only with respect to a desired high frequency signal by means of an input tuning circuit or a high frequency tuning circuit 2 and the output thereof is applied to a subsequent interstage tuning circuit 3. The signal selected by the input tuning circuit 2 is further amplified by the interstage tuning circuit 3 and is applied to a frequency converter comprising a mixer 4 and a local oscillator 5. The mixer 4 of the frequency converter serves to convert the selectively received and amplified television signal into a video intermediate frequency signal by mixing the television signal with a local oscillation frequency signal obtained from the local oscillator 5. The output from the mixer 4, i.e. the video intermediate frequency signal undergoes selective amplification of a predetermined selectivity characteristic by means of a video intermediate frequency circuit 6 and the output therefrom is applied to a subsequent intermediate frequency amplifying and detecting circuit 7. A video signal obtained from the detecting circuit 7 is applied to a video circuit 8. Since this type of a VHF television tuner is well known in the art, it is not believed necessary to describe it in more detail.

A typical conventional VHF television tuner is structured using a rotary switch to implement the blocks 2, 3, 4 and 5 shown in FIG. 1. More specifically, usually such a tuner is structured without incorporating the video intermediage frequency circuit 6 therein, while such a video intermediate frequency circuit 6 is usually disposed in a main print circuit board of a television receiver. Thus, typically such a video intermediate frequency circuit is structured with three transistors, three to five tuning coils and circuit portions associated therewith and is coupled to a tuner by means of a coaxial cable. Naturally the length of such coaxial cable must be changed in accordance with models of television receivers. Accordingly, it follows that a stray capacitance due to such coaxial cable is changeable depending on the types of television receivers. Therefore, it is necessary to change the circuit constant of circuit components of a tuner and a video intermediate frequency circuit depending on the types of television receivers. Furthermore, since undesired radiation could change by moving a coaxial cable, it is necessary to consider employing some expedient to avoid such inconvenience.

Furthermore, in such a conventional television receiver a video intermediate frequency circuit portion occupies approximately a quarter of a main print circuit board. Such an arrangement is liable to adversely affect other circuit portions because of the high frequency and hence necessitates some preventive measure such as a shield or the like. In addition, since a conventional video intermediate frequency circuit has been structured with discrete inductances and capacitances, it is necessary to adjust the characteristic of the circuit. Nevertheless, it is difficult to independently adjust a video intermediate frequency circuit, without connecting a coaxial cable and a tuner. In other words, in adjusting a video intermediate frequency circuit, it is necessary to couple a tuner and a coaxial cable, as described previously.

SUMMARY OF THE INVENTION

Briefly described, the present invention preferably comprises at least three channel switching plates, and a rotary switching shaft for switching for each channel an input tuning portion, an interstage tuning portion and a frequency converting portion in cooperation with the channel switching plates. An additional plate is provided in association with the rotary switching shaft and a surface acoustic wave device is provided on the additional plate, so that the surface acoustic wave device is connected to commonly operate for the respective channels regardless of channel switching by means of the rotary switching shaft.

According to the present invention, a video intermediate frequency filter is implemented by means of a surface acoustic wave device, which is incorporated in the television tuner, itself whereby adjustment of the characteristic is eliminated.

In a preferred embodiment of the present invention, an integrated circuit integrally comprising a video intermediate frequency amplifying circuit and a detecting circuit is provided on the above described additional plate. The integrated circuit receives the output of the suface acoustic wave device and provides a video signal as the output therefrom. In a further preferred embodiment of the present invention, the frequency converting portion and the video intermediate frequency circuit are directly coupled in the tuner. Accordingly, extension of a cable such as a coaxial cable between the video intermediate frequency circuit and the frequency converting portion can be dispensed with.

In general undesired radiation from a television tuner includes that which comes from the antenna terminal, that which comes from the cable extending from the frequency converting portion, and that which comes from the tuner itself. In particular leakage from the cable is conventionally a problem. However, since the cable can be eliminated in a preferred embodiment of the present invention, undesired radiation can be considerably reduced. On the other hand, it is conventionally necessary to change the length of the cable depending on the designing and models of television receivers. Thus, a stray capacitance caused by a cable has exerted an influence upon the constant value of circuit components in the tuner and the video intermediate frequency circuit. However, since such a cable can be dispensed with in a preferred embodiment of the present invention, a change of such constants of circuit components provided up to a detector becomes unnecessary. Furthermore, elimination of necessity of such cable also eliminates variation of undesired radiation due to dislocation of a cable.

In a further preferred embodiment of the present invention, an additional plate is disposed between a switching plate associated with a frequency converting portion and a switching plate associated with an interstage tuning portion. Generally, a portion of the undesired radiation from a television tuner is due to radiation through an antenna of an undesired wave generated by a local oscillator. Accordingly, by disposing an additional plate provided with a surface acoustic wave device between the switching plate associated with a frequency converting portion including a local oscillator and the switching plate associated with an interstage tuning portion, the distance between the switching plate associated with the frequency converting portion and an input tuning portion and thus an antenna terminal is increased, thereby reducing the above described undesired radiation. Furthermore, since a video intermediate frequency circuit is disposed between the switching plate associated with the frequency converting portion and the switching plate associated with the interstage tuning portion, this serves to perform a shielding effect of an electromagnetic wave from the local oscillator, which further reduces undesired radiation. More specifically, since the video intermediate frequency circuit has been grounded at many portions, radiation of an electromagnetic wave from a local oscillator is effectively prevented. By providing a shield plate between the respective switching plates, undesired radiation is further reduced.

Accordingly, a principal object of the present invention is to provide an improved television tuner.

Another object of the present invention is to provide a television tuner which is easy to handle and thus excellent for mass-production.

A further object of the present invention is to provide an improved television tuner wherein undesired radiation is reduced.

Still another object of the present invention is to provide a television tuner which is easy in designing.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
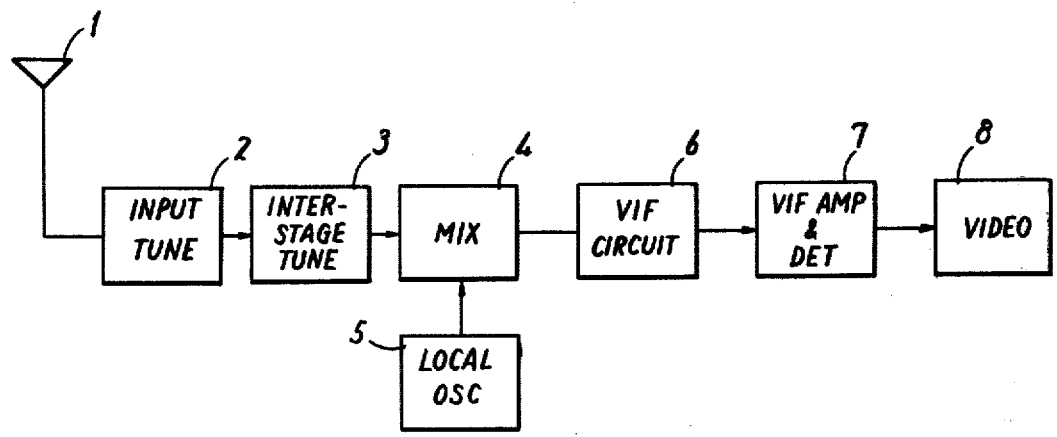
FIG. 1 is a block diagram showing a portion of a television receiver in which the present invention can be advantageously employed.
Figure 2:
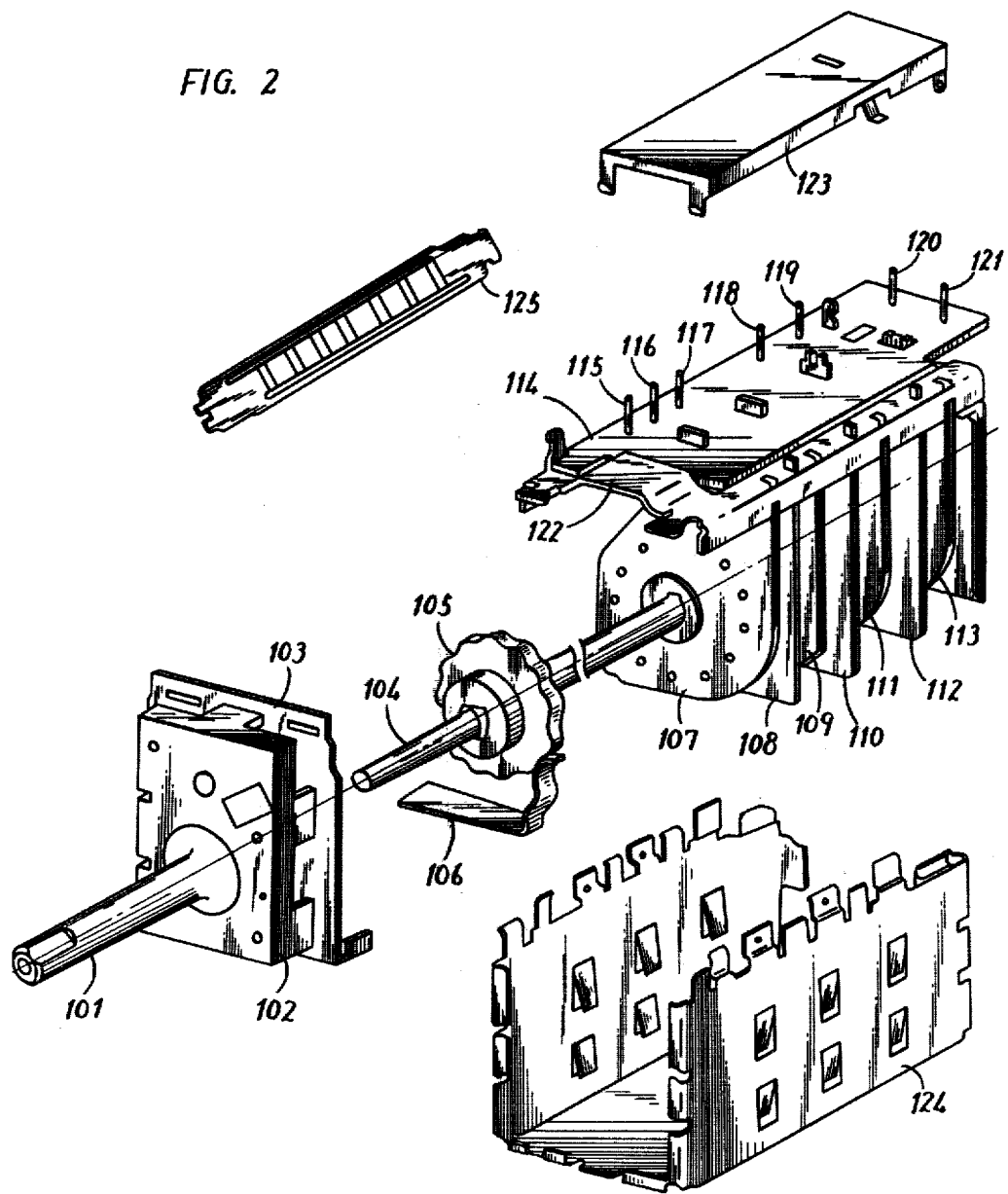
FIG. 2 is a perspective view of one embodiment of the television tuner in accordance with the present invention, disassembled.

FIG. 2 is a perspective view showing one example of a disassembled rotary switch type television tuner, embodying the present invention. The television tuner shown is structured to comprise the circuit portions, 2, 3, 4, 5 and 6 and preferably 7 shown in FIG. 1. The television tuner further comprises a channel switching shaft 104. The channel switching shaft 104 is integrally provided with a detent rotor 105 for intermittent rotational positioning of the shaft 104. The switching shaft 104 is inserted through apertures of a switching plate 107 for a frequency converting stage including the mixer 4 and the local oscillator 5, a plate 109 for a video intermediate frequency circuit which constitutes a feature of the present invention, a switching plate 111 for the interstage tuning portion 3 shown in FIG. 1 and a switching plate 113 for the input tuning portion 2 shown in FIG. 1. Shield plates 108, 110 and 112 as well as these plates 107, 109, 111 and 113 are fixed, with predetermined spacings, to a main chassis 122. The plates 107, 111 and 113 are structured to comprise a conventional circuit structure including channel switching contacts.

The switching shaft 104 is disposed to extend through apertures of a preset plate 103, a front plate 102 covering the plate 103, and a fine tuning shaft 101 secured rotatably to the front plate 102 and associated with the preset scheme, so that the tip end of the shaft 104 protrudes forward cleft-ward, in FIG. 2) of the end of the shaft 101 when the tuner is assembled. A channel switching knob and a fine tuning knob are provided on the shafts 104 and 101, respectively. A main cover 124 is fixed to the above described main chassis 122 so as to enclose the plates 107, 109 111 and 113 and the shield plates 108, 110 and 112. The main chassis 122 is provided with a print circuit board 114 formed with a metallic foil covering the surface of the chassis 122. Terminals 115, 116, 117, 118, 119, 120 and 121 are fixed to and through the main chassis 122 and thus the print circuit board 114. The terminals 115 to 121 are described with reference to FIG. 5. The terminal 115 constitutes a +B terminal and the terminal 116 constitutes a video detected output terminal. The terminal 117 constitutes an automatic gain control voltage terminal. The terminal 118 constitutes a terminal for power supply to the tuner when a UHF channel is selected and the terminal 119 constitutes a terminal for supplying a UHF signal as converted from a UHF tuner. The terminals 120 and 121 are terminals for applying a VHF television signal received by the antenna 1 and having an impedance of 300 ohms. The main chassis 122 is further provided with a subcover 123 for covering these terminals.

The tuner shown further comprises a support stator 125 and a detent spring 106 engageable with the detent rotor 105 to achieve a clip stop when the switching shaft 104 is rotated.

Figure 3:
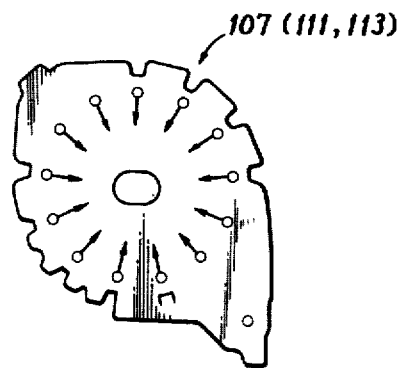
FIG. 3 is a view showing a configuration of a switching plate.
Figure 4:
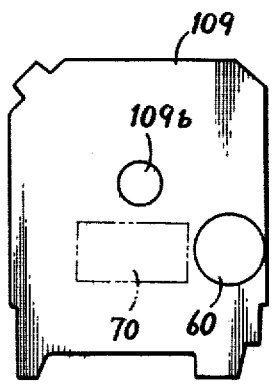
FIG. 4 is a view showing an example of a configuration of an additional plate which constitutes a feature of the present invention.

Referring to FIG. 4, the plate 109 constituting the feature of the present invention will be described in comparison with the other type of switching plate used for plates 107, 111 and 113 and shown in FIG. 3 FIG. 3 shows a configuration of the switching plates 107, 111 and 113 and FIG. 4 shows a preferred configuration of the plate 109. As is well known in the art, each of the switching plates 107, 111 and 113 comprises thirteen contacts being selectively rendered conductive by means of a contact clip, not shown, rotating integrally with the switching shaft 104. These contacts correspond to twelve VHF channels and one UHF channel, respectively. Accordingly, in order to achieve a circuit configuration unique to each channel, as each channel is selected, the lengths of these contacts are each uniquely selected with respect to the blades 107a, 111a, 111b, 113a, 113b provided on the respective plates 107, 111 and 113, as is well known in the art.

On the other hand, the plate 109 constituting the feature of the present invention does not necessarily require such contacts for channel selection, because it is necessary that the circuit components provided on the plate 109 operate commonly to the respective channels. According to the present invention, the plate 109 is provided with a surface acoustic wave device 60 constituning the video intermediate frequency circuit 6 and preferably but not necessarily further has a one-chip integrated circuit 70 constituting the video intermediate frequency amplifier and the detecting circuit 7. The surface acoustic wave device 60 and the integrated circuit 70 are electrically coupled to be operable without regard to channel selection by means of the switching shaft 104. Accordingly, it follows that the surface acoustic wave device 60 and the integrated circuit 70 provided on the plate 109 operate commonly to all of the channels.

Figure 5:
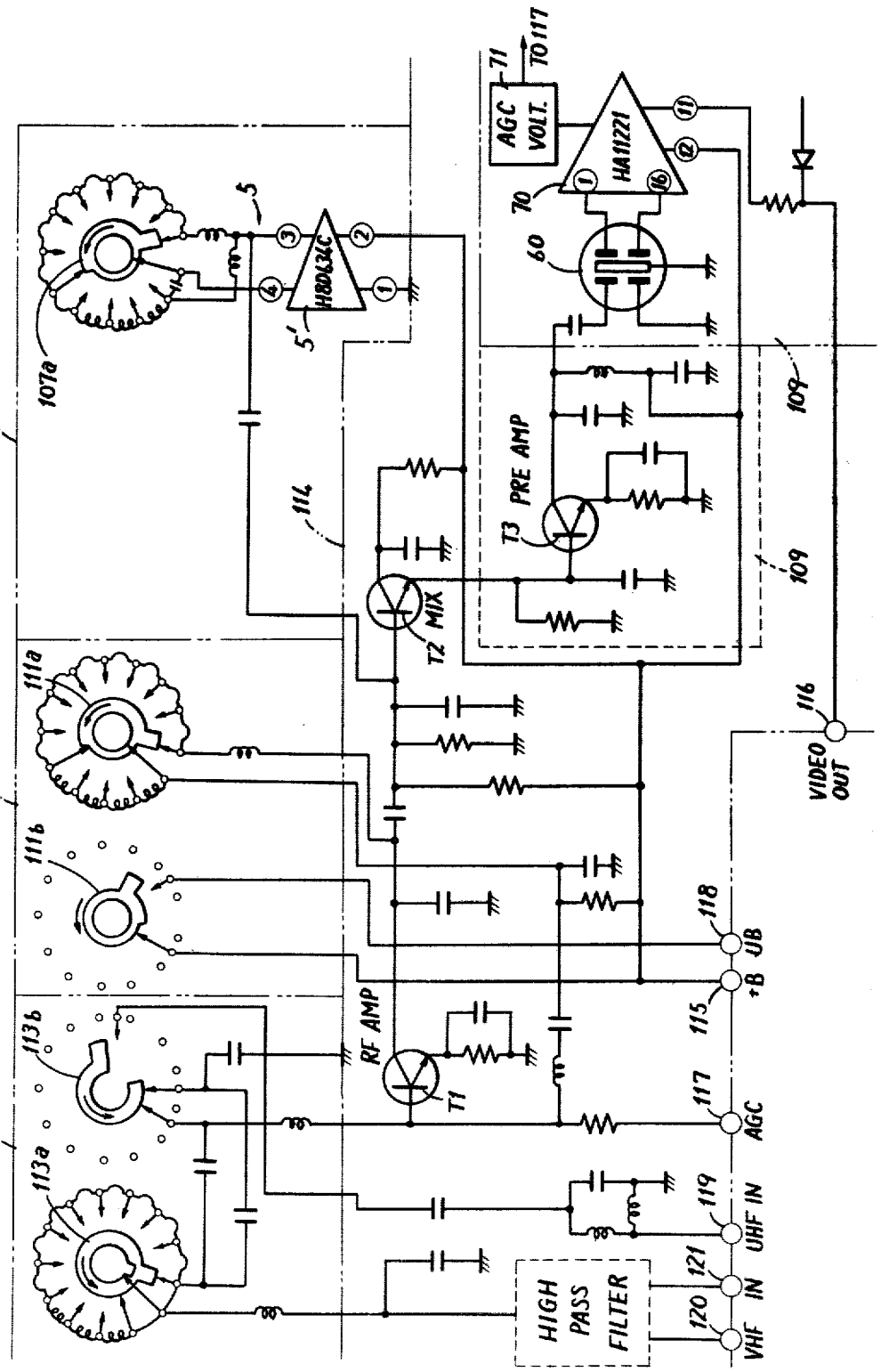
FIG. 5 is a schematic diagram of one embodiment of the present invention.

FIG. 5 is a schematic diagram of one embodiment of the present invention. The switching plate 107 is provided with a blade 107a for switching the local oscillator 5 for each channel, as shown in FIG. 5. The switching plate 111 is provided with blades 111a and 111b for switching an interstage tuning frequency for each channel. Similarly, the switching plate 113 is provided with blade 113a and 113b for switching an input tuning frequency so as to correspond to each channel. The tuner plate, i.e. the print circuit board 114, is provided with various circuit components in association with the input tuning portion, the interstage tuning portion and the frequency converting portion. More specifically, a transistor T1 is provided to constitute a high pass filter and a high frequency amplifier in the input tuning portion. Capacitors and resistors are also provided to constitute the interstage tuning portion in a known manner. A further transistor T2 is provided to constitute the frequency converting portion, i.e. the mixer 4. A hybrid integrated circuit 5' and the associated coil and other known circuitry constitute the local oscillator 5.

The additional plate 109 constituting the feature of the present invention is provided with the surface acoustic wave device 60 and the integrated circuit 70, as described previously. Furthermore, as enclosed with the dotted line in FIG. 5, a transistor T3 and the like constituting the preamplifier for the surface acoustic wave device 60 may also be provided on the plate 109. By way of the surface acoustic wave device 60, Model No. SAF58MB manufactured by Murata Manufacturing Co., Ltd., Japan, may be used. By way of the integrated circuit 70, Model HA11221 manufactured by Hitachi, Ltd., Japan, may be used. By way of the local oscillator 5, a hybrid integrated circuit, Model No. H8D634C manufactured by Murata Manufacturing Co., Ltd., Japan, may be used. A circuit 71 for generating an automatic gain control voltage is coupled to the integrated circuit 70. The automatic gain control voltage generating circuit 71 may be provided on the additional plate 109 using discrete circuit components. A voltage obtained from the circuit 71 is applied to the terminal 117.

Although in the above described embodiments, the video intermediate frequency amplifier and the detecting circuit were implemented as a one-chip integrated circuit 70, alternatively the same may be implemented using discrete circuit components. However, in consideration of simplicity of assemblage and adjustment and compactness thereof, it is preferred to implement the same with an integrated circuit.

Although in the above described embodiments the switching plates were implemented by three plates, the present invention is equally applicable to the case where two switching plates are used for the interstage tuning portion to comprise a so-called double tuning type tuner.

What is claimed is:

1. A rotary switching type television tuner, comprising:
   a rotary switching shaft;
   first, second and third planar channel switching plates located generally parallel to each other, said second channel switching plate being located between said first and third channel switching plates;
   input tuning means for selectively amplifying one of a plurality of signals applied thereto, said input tuning means being secured to said first channel switching plate; said input tuning means also being operationally coupled to said shaft such that the signal amplified by said input tuning means is determined by the rotary position of said shaft;
   interstage tuning means for further amplifying said signal amplified by said input tuning means, said interstage tuning means being coupled to said second channel switching plate; said interstage tuning means also being operationally coupled to said shaft such that the operation of said interstage tuning means is controlled by the rotary position of said shaft means;
   frequency converting means for converting the frequency of said signal amplified by said interstage tuning means, said frequency converting means being coupled to said third channel switching plate, and said frequency converter means also being operationally coupled to said shaft such that the operation of said frequency converting means is controlled by the rotary position of said shaft;
   an additional plate;
   housing means containing said channel switching plates and said additional plate and receiving said shaft; said channel switching plates and said additional plate being located along and substantially orthogonal to said shaft; said housing means maintaining said additional plate between said second and third channel switching plates and maintaining said additional plate substantially immovable relative to said plurality of channel switching plates such that said tuner, including all of said plates, can be installed as a unit in a television receiver;
   a surface acoustic wave device, comprising a video intermediate frequency filter, on said additional plate to receive said frequency converted signal, the operation of said surface acoustic wave device being independent of the rotary position of said shaft; and
   a shield plate disposed in said housing means between said first and second channel switching plates.

2. A television tuner in accordance with claim 1, which further comprises video intermediate frequency amplifier means provided on said additional plate and coupled to receive the output of said surface acoustic wave device.

3. A television tuner in accordance with claim 2, which further comprises video detector means provided on said additional plate and coupled to receive the output of said video intermediate frequency amplifier means.

4. A television tuner in accordance with claim 3, wherein said video intermediate frequency amplifier means and said video detector means form at least part of an integrated circuit.

5. A television tuner in accordance with claim 1, which further comprises an additional shield plate, said additional shield plate being provided between said additional plate and one of said second and third channel switching plates.

* * * * *